United States Patent
Yu et al.

(10) Patent No.: US 7,133,297 B2
(45) Date of Patent: Nov. 7, 2006

(54) SLOT APPARATUS FOR MEMORY MODULE

(75) Inventors: Long-Kun Yu, Taipei (TW); Yao-Hui Wu, Taipei (TW)

(73) Assignee: VIA Technologies, Inc., Taipei (TW)

( * ) Notice: Subject to any disclaimer, the term of this patent is extended or adjusted under 35 U.S.C. 154(b) by 180 days.

(21) Appl. No.: 10/825,236

(22) Filed: Apr. 16, 2004

(65) Prior Publication Data

US 2004/0252470 A1    Dec. 16, 2004

(30) Foreign Application Priority Data

Jun. 12, 2003 (TW) .............................. 92210725 U

(51) Int. Cl.
*H05K 1/11* (2006.01)
*H05K 1/14* (2006.01)

(52) U.S. Cl. .................. 361/803; 361/764; 361/766

(58) Field of Classification Search ............... 361/803, 361/785; 365/52–53; 710/2, 301
See application file for complete search history.

(56) References Cited

U.S. PATENT DOCUMENTS

| | | | | |
|---|---|---|---|---|
| 5,495,584 A | * | 2/1996 | Holman et al. | ............. 710/316 |
| 5,747,893 A | * | 5/1998 | Bennett et al. | ............. 307/100 |
| 6,115,278 A | * | 9/2000 | Deneroff et al. | ............. 365/52 |
| 6,128,685 A | * | 10/2000 | Cronin | ........................ 710/301 |
| 6,665,736 B1 | * | 12/2003 | Fan | ............................... 710/2 |

* cited by examiner

*Primary Examiner*—Tuan Dinh
(74) *Attorney, Agent, or Firm*—Rabin & Berdo, P.C.

(57) ABSTRACT

A slot apparatus for a memory module on a printed circuit board. The slot apparatus includes a first memory slot set, a second memory slot set, a terminal resistor, and a serial resistance. The first and second memory slot sets are disposed on the printed circuit board. The terminal resistor is disposed between the first and second memory slot sets. The serial resistance is disposed on the printed circuit board and is electrically connected to the first and second memory slot sets through the printed circuit board. The terminal resistor is respectively and electrically connected to the first and second memory slot sets through the printed circuit board. The terminal resistor and the first and second memory slot sets are connected to a terminator voltage.

10 Claims, 4 Drawing Sheets

SLOT APPARATUS FOR MEMORY MODULE

BACKGROUND OF THE INVENTION

1. Field of the Invention

The present invention relates to a motherboard, and in particular to a slot apparatus for DRAM memory module.

2. Description of the Related Art

Digital information is often stored in dynamic random access memory (DRAM). One type of DRAM transfers information synchronously with a clock signal. This type of DRAM is referred to as synchronous DRAM (SDRAM). SDRAM provides a burst read access (when programmed for a burst length of 4). In the case of 64-bit data bus interface system, such a transfer involves 32 bytes of data per SDRAM access. Current PC systems, for example PC100 or PC133 systems typically use such an arrangement. SDRAM transfers information once during every cycle of the clock signal, for example, at the rising edge of the clock signal. Double data rate DRAM (DDR DRAM), however, transfers data at both edges of the clock signal (i.e., twice during every cycle of the clock signal), thus doubling the peak throughput of the memory device as compared with SDRAM. DDR DRAM thus provides a burst of eight data transfers on every burst read access (when programmed for a burst length of 4). As a result, the operating speed of the memory can be increased.

Therefore, DDR DRAM offers better performance and lower cost than SDRAM. Furthermore, DDR DRAM offers broader bandwidth than SDRAM, and the higher operating speed of DDR DRAM is highly applicable to multimedia and entertainment products. With DDR DRAM, the motherboard layout is redesigned and a dual channel type memory slot set is used for insertion of the DDR RAM. The dual channel type memory slot set means that two DDR DRAMs are inserted in a into each memory slot set of a dual in-line memory module (DIMM). The bandwidth of DRAM can be increased to 4.27 GB/s due to the dual channel framework effectively increasing the operational performance. When the primary frequencies of two DDR DIMMs are equal, and the difference between the phases of the two DDR DIMMs is ¼ clock cycle, the combined data can be read in one clock cycle.

FIG. 1 is a conventional motherboard 100 with DDR DIMM. The motherboard 100 includes a CPU slot 101, a control chipset 102, differential clock generator 103, memory slots 104, 105, 106 and 107, terminator circuit 108, and terminal resistor 109. The DDR DIMM requires a terminator circuit 108 disposed at an end of the arranged memory slots 104, 105, 106 and 107 to provide terminator voltage $V_{TT}$ for absorbing the reflecting electric wave. Meanwhile, the receiving data bus of DDR DIMM has full-up resistors.

FIG. 2 shows the arrangement of a conventional motherboard, wherein the same symbols are given in FIG. 2 for further description. The serial resistance 110 connects the control chipset 102 and the memory slots 104, 105, 106 and 107 as a full-up resistor. The terminator circuit 108 is disposed beside the memory slots 104, 105, 106 and 107. The terminal resistor 109, memory slots 104, 105, 106 and 107, and the serial resistance 110 are connected to one terminator voltage $V_{TT}$.

The memory slots 104 and 106 are a first memory slot set and the memory slots 105 and 107 are a second memory slot set. The memory slots 104, 105, 106 and 107 of the conventional motherboard are alternately arranged, hence the distance is increased between two memory slots in one set. Meanwhile, the distance between the terminator circuit 108 and the memory slot sets is increased, and the distance of the reflecting electric wave is also increased. Another defect of the terminator circuit 108 disposed at an end of the memory slots 104, 105, 106 and 107 is that the distance between the control chipset 102 and the memory slot which has terminal voltage is increased such that the reflection of the electric wave is enhanced, and the noise is also increased. Finally, the stability of the DDR DRAM suffers.

SUMMARY OF THE INVENTION

Accordingly, an object of the invention is to provide a motherboard that is better than the conventional motherboard.

The motherboard of the present invention includes a printed circuit board, a first memory slot set, a second memory slot set, and a terminator circuit module. The first memory slot set is disposed on the printed circuit board and has a first memory slot and a second memory slot. The second memory slot set is disposed on the printed circuit board and has a third memory slot and a fourth memory slot. The terminator circuit module is disposed between the first memory slot set and the second memory slot set. The terminator circuit module is electrically connected to the first memory slot set and the second memory slot set through the printed circuit board.

The terminator circuit module includes a plurality of resistors and a plurality of capacitors, and the resistors and the capacitors are connected in series.

The resistors and the capacitors are electrically connected in series and alternately arranged.

Another object of the invention is to provide a motherboard including a circuit board, a chipset, a first memory slot set, a second memory slot set, a terminal resistor, and a serial resistance. The chipset is disposed on the circuit board. The first memory slot set is disposed on the circuit board and has a first memory slot and a second memory slot. The second memory slot set is disposed on the circuit board and has a third memory slot and a fourth memory slot. The terminal resistor is disposed between the first memory slot set and the second memory slot set. The serial resistance is disposed between the chipset and the first and the second memory slot sets. The terminal resistor is electrically connected to the first memory slot set and the second memory slot set through the circuit board. The terminal resistor, the first memory slot set and the second memory slot set are connected to a terminator voltage.

The motherboard further includes a plurality of capacitors. The terminal resistor and the plurality of capacitors are alternately arranged.

Another object of the invention is to provide a slot apparatus for a memory module on a printed circuit board. The slot apparatus includes a first memory slot set, a second memory slot set, a terminal resistor, and a serial resistance. The first memory slot set is disposed on the printed circuit board and has first and second memory slots. The second memory slot set is disposed on the printed circuit board and has a third memory slot and a fourth memory slot. The terminal resistor is disposed between the first memory slot set and the second memory slot set. The serial resistance is disposed on the printed circuit board and is electrically connected to the first memory slot set and the second memory slot set through the printed circuit board. The terminal resistor is respectively and electrically connected to the first memory slot set and the second memory slot set through the printed circuit board. The terminal resistor, the first memory slot set and the second memory slot set are connected to a terminator voltage.

The slot apparatus further includes a plurality of capacitors, wherein the terminal resistor and the plurality of capacitors are alternately arranged.

The slot apparatus further includes a chipset disposed on the printed circuit board. The serial resistance is disposed between the chipset and the first and second memory slot sets.

According to the present invention, the two memory slots in one set are arranged contiguously and a terminator circuit module is disposed therebetween, and the two memory slot sets are connected to the same terminator voltage so that the reflection of the electric waves decreases when dual channel type DDR DIMM is disposed on the motherboard, and the working voltage is increasing, saving space on the motherboard.

A detailed description is given in the following embodiment with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
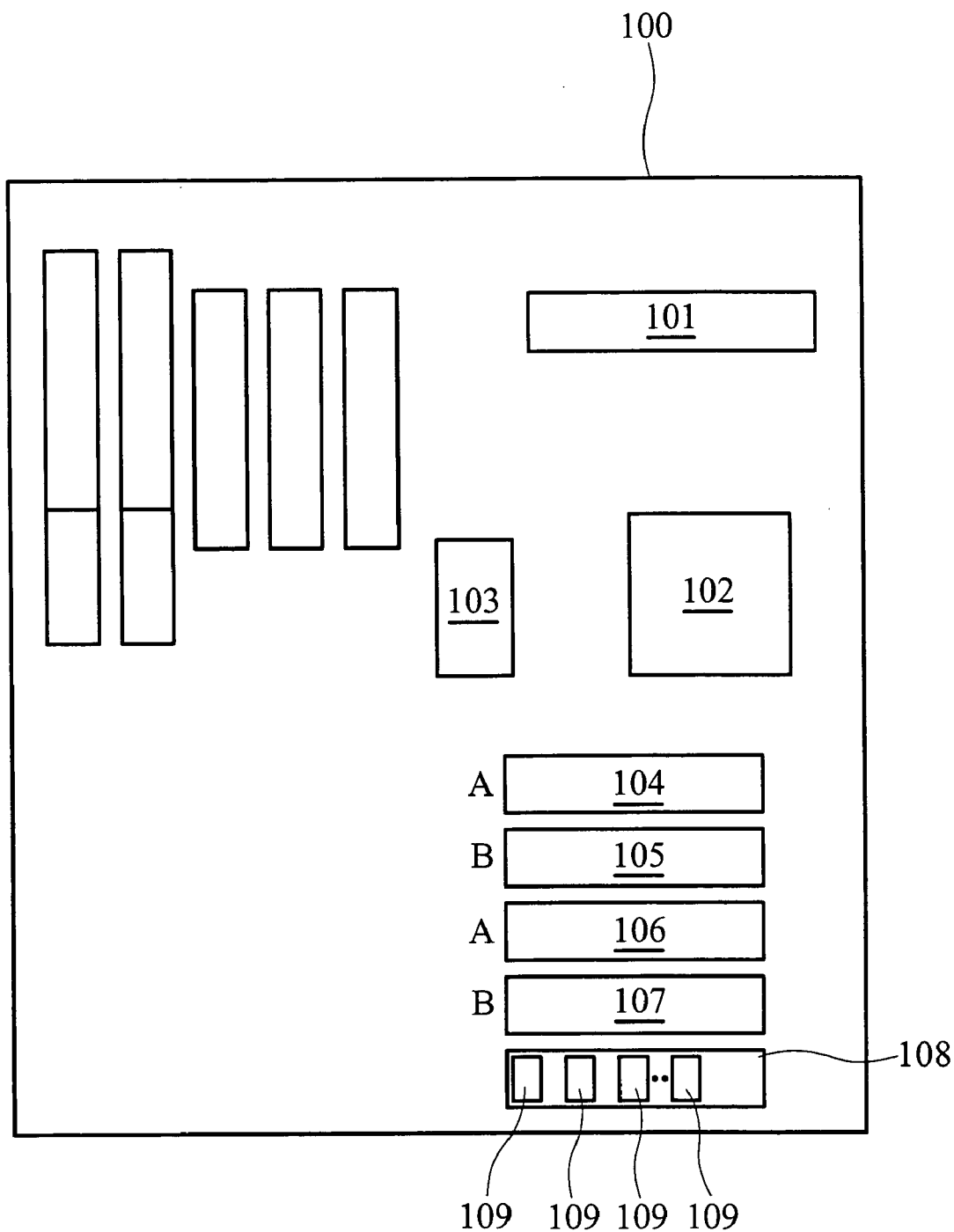
FIG. 1 is a schematic diagram showing a conventional motherboard.
Figure 2:
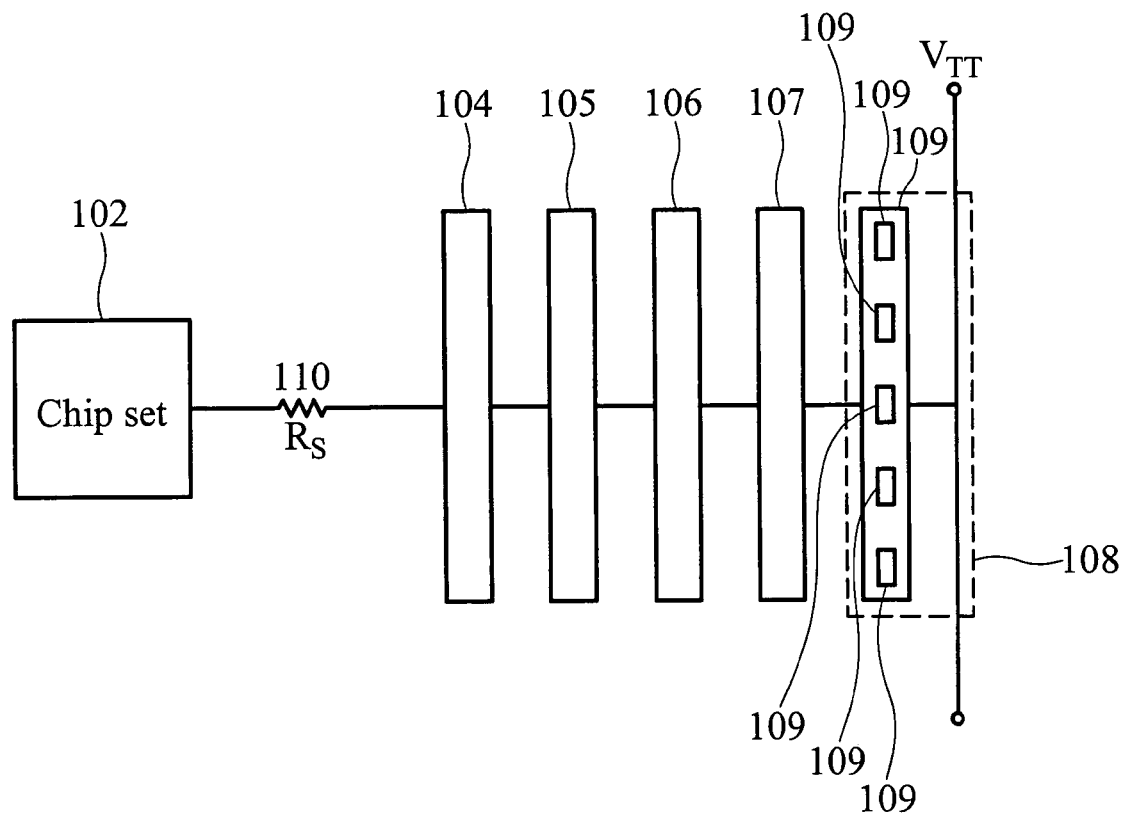
FIG. 2 is a schematic diagram showing an arrangement of a conventional motherboard.
Figure 3:
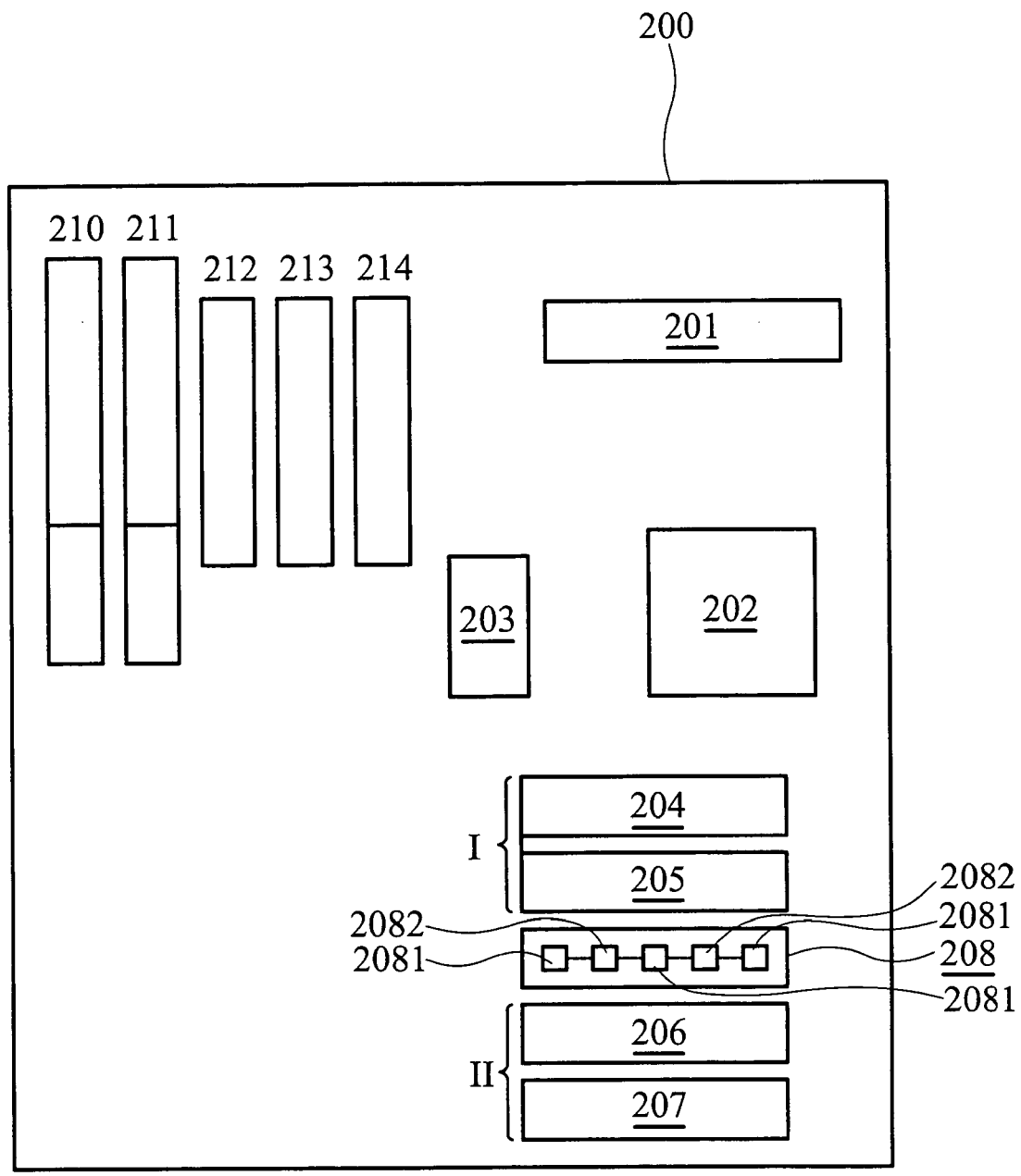
FIG. 3 is a schematic view showing the present invention.

FIG. 3 shows a schematic view of a motherboard 200 according to the present invention. The motherboard 200 includes a CPU slot 201, a control chip 202, a differential clock generator 203, a first memory slot set I, a second memory slot set II, a terminator circuit module 208, a plurality of PCI slots 212–214, and a plurality of ISA slots 210–211.

The first memory slot set I includes a first memory slot 204 and a second memory slot 205 for respectively plugging the DDR DRAM in. The second memory slot set II includes a third memory slot 206 and a fourth memory slot 207 for respectively inserting the DDR DRAM. The terminator circuit module 208 includes a plurality of terminal resistors 2081 and a plurality of capacitors 2082. The plurality of terminal resistors 2081 and the plurality of capacitors 2082 are electrically connected in series and alternately arranged.

The CPU slot 201 is for insertion of a CPU. The control chipset 202 controls the dual channel type DDR DRAM module. The differential clock generator 203 generates the differential clock signal required by the dual channel type DDR DRAM module.

The terminator circuit module 208 is disposed between the first memory slot set I and the second memory slot set II for completely separating the first memory slot set I from the second memory slot set II. The same set of memory slots is disposed on the same side of the terminator circuit module 208. The terminator circuit module 208 provides terminator voltage to the receiving data bus of the first memory slot set I and the second memory slot set II. Additionally, the plurality of terminal resistors 2081 absorb the electric wave from the data bus transferring line of the DDR DRAM module and decreases the reflecting electric wave. The capacitors 2082 filter out the high and low frequency noise to steady the terminator voltage.

Figure 4:
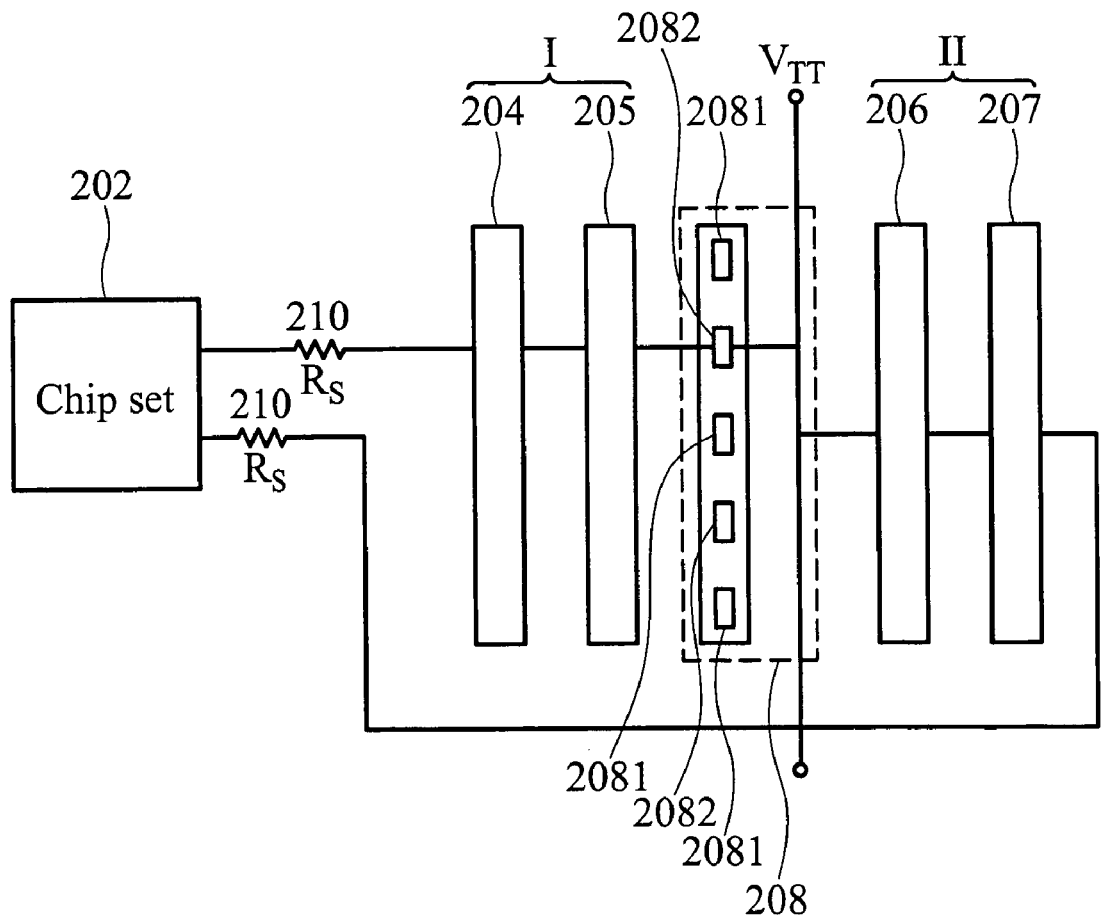
FIG. 4 is a schematic showing an arrangement of the present invention.

FIG. 4 shows the arrangement of the present invention; same symbols are given in FIG. 3 for further descriptions. The serial resistance 210 connects the control chipset 202, the first memory slot 204 and the second memory slot 205 as a pull-up resistor. Another serial resistance 210 connects the control chipset 202, the third memory slot 206 and the fourth memory slot 207. The first memory slot set I and the second memory slot set II are connected to the control chipset 202 via the independent paths on the printed circuit board. For example, the independent paths are respectively disposed on each surface of the printed circuit board to decrease the distance therebetween. This arrangement prevents wasted voltage due to the first memory slot set I between the second memory slot set II and the control chipset 202 as in the conventional arrangement. The plurality of terminal resistors 2081, the plurality of capacitors 2082, the first memory slot set I, the second memory slot set II, and the individual serial resistances 210 are connected to the terminator circuit module 208 having a terminator voltage.

The arrangement of the present invention has the following advantages. More space is made available on the printed circuit board. The terminator circuit module 208 is disposed between the first memory slot set I and the second memory slot set II to decrease the distance therebetween. The reflecting electric wave has been decreased and does not affect the working voltage. In the terminator circuit module 208, the plurality of capacitors 2082 for filtering noise and the plurality of terminal resistors 2081 for absorbing the reflecting electric wave are alternately arranged to decrease the ESR of the terminator circuit module 208.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A motherboard, comprising:
  a printed circuit board;
  a first memory slot set disposed on the printed circuit board having a first memory slot and a second memory slot;
  a second memory slot set disposed on the printed circuit board having a third memory slot and a fourth memory slot;
  and a terminator circuit module disposed between the first memory slot set and the second memory slot set comprising a plurality of resistors, wherein a terminator voltage is connected to the first memory slot set, the second memory slot set, and the plurality of resistors through the printed circuit board.

2. The motherboard as claimed in claim 1, wherein the terminator circuit module further comprises a plurality of capacitors, and the plurality of resistors and the plurality of capacitors are connected in series.

3. The motherboard as claimed in claim 1, wherein the first, second, third and fourth memory slot are used for plugging in a memory device.

4. The motherboard as claimed in claim 2, wherein the plurality of resistors and the plurality of capacitors are electrically connected in series and alternately arranged.

5. A motherboard, comprising:
- a circuit board;
- a chipset disposed on the circuit board;
- a first memory slot set disposed on the circuit board having a first memory slot and a second memory slot;
- a second memory slot set disposed on the circuit board having a third memory slot and a fourth memory slot;
- a plurality of terminal resistors disposed between the first memory slot set and the second memory slot set; and
- a serial resistance disposed between the chipset and the first and the second memory slot sets, wherein the plurality of terminal resistors is electrically connected to the first memory slot set and the second memory slot set through the circuit board, and the plurality of terminal resistors, the first memory slot set and the second memory slot set are connected to a terminator voltage.

6. The motherboard as claimed in claim 5, further comprising a plurality of capacitors, wherein the plurality of terminal resistors and the plurality of capacitors are alternately arranged.

7. A slot apparatus for a memory module on a printed circuit board, comprising:
- a first memory slot set disposed on the printed circuit board having a first memory slot and a second memory slot;
- a second memory slot set disposed on the printed circuit board having a third memory slot and a fourth memory slot;
- a plurality of terminal resistors disposed between the first memory slot set and the second memory slot set; and
- a serial resistance disposed on the printed circuit board and electrically connected to the first memory slot set and the second memory slot set through the printed circuit board, wherein the plurality of terminal resistors are respectively and electrically connected to the first memory slot set and the second memory slot set through the printed circuit board, and the terminal resistors, the first memory slot set and the second memory slot set are connected to a terminator voltage.

8. The slot apparatus for a memory module as claimed in claim 7, further comprising a plurality of capacitors, wherein the plurality of terminal resistors and the plurality of capacitors are alternately arranged.

9. The slot apparatus for a memory module as claimed in claim 7, wherein the printed circuit board is a motherboard.

10. The slot apparatus for a memory module as claimed in claim 9, further comprising a chipset disposed on the printed circuit board, wherein the serial resistance disposed between the chipset and the first and the second memory slot sets.

* * * * *